(12) United States Patent
Miyagi et al.

(10) Patent No.: US 7,403,140 B2
(45) Date of Patent: Jul. 22, 2008

(54) RECEIVER, DIGITAL-ANALOG CONVERTER AND TUNING CIRCUIT

(75) Inventors: Hiroshi Miyagi, Niigata (JP); Isami Kato, Kariya (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 11/751,034

(22) Filed: May 20, 2007

(65) Prior Publication Data
US 2007/0216560 A1    Sep. 20, 2007

Related U.S. Application Data

(62) Division of application No. 10/533,359, filed as application No. PCT/JP03/13105 on Oct. 14, 2003, now Pat. No. 7,286,804.

(30) Foreign Application Priority Data
Oct. 29, 2002    (JP)    ............... 2002-314641

(51) Int. Cl.
*H03M 1/06*    (2006.01)
(52) U.S. Cl. ....................... 341/119; 341/155
(58) Field of Classification Search ................ 341/155, 341/118, 119; 455/169.1; 702/130
See application file for complete search history.

(56) References Cited

U.S. PATENT DOCUMENTS

| | | | |
|---|---|---|---|
| 4,220,922 A | 9/1980 | Ikeguchi | |
| 4,837,852 A | 6/1989 | Takada et al. | |
| 5,428,829 A | 6/1995 | Osburn et al. | |
| 5,781,851 A | 7/1998 | Saito | |
| 6,188,970 B1 | 2/2001 | Becker et al. | |
| 6,243,570 B1 | 6/2001 | Kobayashi | |
| 6,704,555 B2 | 3/2004 | Sih et al. | |
| 7,120,407 B2 | 10/2006 | Miyagi | |
| 2007/0005289 A1* | 1/2007 | Huang | ...................... 702/130 |

FOREIGN PATENT DOCUMENTS

| | | |
|---|---|---|
| JP | 61-118026 | 6/1986 |
| JP | 4-358422 | 12/1992 |
| JP | 09-069757 | 3/1997 |
| JP | 2002-319846 | 10/2002 |
| JP | 2002/111527 | 4/2004 |

* cited by examiner

*Primary Examiner*—Peguy JeanPierre
(74) *Attorney, Agent, or Firm*—patenttm.us

(57) ABSTRACT

An object of the present invention is to provide a receiver, a digital-analog converter and a tuning circuit in which temperature compensating components can be formed on a semiconductor substrate while reducing component costs. An FM receiver 100 is constituted by including an antenna 1, a high frequency receiving circuit 2, a local oscillator 3, two digital-analog converters (DACs) 4, 6, a control section 8, a mixing circuit 9, an intermediate frequency amplification circuit 10, a detection circuit 11, a low frequency amplification circuit 12 and the speaker 13. The DACs 4, 6 have a predetermined temperature coefficient, of which output voltage is changed in accordance with ambient temperature. When a characteristic of VCO 31 is changed with variations of ambient temperature so as to cause a control voltage applied to the VCO 31 to be changed, output voltages of the DACs 4, 6 are also changed similarly.

6 Claims, 3 Drawing Sheets

RECEIVER, DIGITAL-ANALOG CONVERTER AND TUNING CIRCUIT

TECHNICAL FIELD

The present invention relates to a receiver, a digital-analog converter, and a tuning circuit adopting a superheterodyne system.

BACKGROUND ART

Generally, in a receiver receiving broadcast waves of AM broadcasting and FM broadcasting etc., a superheterodyne system is adopted as a receiving method. The superheterodyne system is a receiving system in which a received broadcast signal is mixed with a predetermined local oscillation signal so as to be converted to an intermediate frequency signal having a fixed frequency independent of the frequency of the reception signal (reception frequency), and thereafter subjected to a detection processing and amplification so as to be reproduced as a voice signal, and which is characterized in that the system is more excellent in sensibility and selectivity, etc. than the other receiving methods.

In the receiver adopting such superheterodyne system, a local oscillator, an antenna tuning circuit and a RF tuning circuit are all controlled by a same DC voltage (see, for example, pages 8 to 14, FIGS. 1 to 8 of Japanese Patent Laid-Open No. 4-358422). A resonance circuit is included in these circuits, of which resonance frequency can be changed by making variable the capacitance of a variable capacitance diode constituting a part of the resonance circuit. In this way, in the case where each resonance frequency is controlled by a common DC voltage, since the variable capacitance diode included in each resonance circuit has a similar temperature characteristic, the resonance frequency of each resonance circuit tends to vary in the same direction when the temperature of the receiver is changed, as a result of which a tracking error is arranged to be settled within a predetermined range without using a particular temperature compensating circuit.

In the conventional system in which each resonance circuit is controlled by a common DC voltage in this manner, since it is difficult to reduce the tracking error generated in both the lower limit frequency and the upper limit frequency of a reception frequency such as in the case where the reception frequency has a wide variable range, there is also provided a receiver in which each tuning frequency of the antenna tuning circuit and the RF tuning circuit is controlled by a DC voltage generated by a D/A converter independently of the common DC voltage (for example, see a column of embodiment of the above Japanese Patent Laid-Open No. 4-358422). Generally, when the DC voltage controlling the local oscillation is varied due to the temperature, the DC voltage outputted from the D/A converter is not varied in the same way as the DC voltage controlling the local oscillation, so that another temperature compensating circuit is needed. For example, a temperature compensating capacitor is used for apart of the antenna tuning circuit and the RF tuning circuit.

As another prior art for preventing expansion of the tracking error without using the temperature compensating capacitor in the receiver using the D/A converter, there is known a receiver in which the variation of the DC voltage is reflected on the D/A conversion output by using the DC voltage controlling the local oscillation as a reference voltage of the D/A converter (see Japanese Patent Laid-Open No. 2002-111527).

However, as disclosed in Japanese Patent Laid-Open No. 4-358422 described above, in the case where the tuning frequency of the antenna tuning circuit and the RF tuning circuit is controlled by using the D/A converter, although it is possible to prevent expansion of the tracking error by using the temperature compensating capacitor, there is a problem that the temperature compensating capacitor is generally expensive and component costs and the total cost of the receiver increase. For example, although a temperature compensating ceramic capacitor of which temperature coefficient can be selected from a plurality of temperature coefficients is commercially available, such capacitor is more expensive than a general purpose capacitor or other elements.

Since the above described temperature compensating capacitor is manufactured by a process different from a common semiconductor manufacturing process, there is also a problem that the capacitor can not be integrally formed on a semiconductor substrate with other components. Accordingly, even when components are made to be contained in a single chip, the temperature compensating capacitor needs to be attached as an external component, causing a cost increase due to an increase in man-hour for assembling.

DISCLOSURE OF THE INVENTION

The present invention has been made in view of the above described circumstances. An object of the present invention is to provide a receiver, a digital-analog converter and a tuning circuit in which temperature compensating components can be formed on a semiconductor substrate while reducing component costs.

In order to solve the above described problem, according to the present invention, there is provided a receiver comprising: a high frequency receiving circuit for which a reception frequency in accordance with a tuning voltage is set; a local oscillator for generating a local oscillation signal of a frequency in accordance with a control voltage; a mixing circuit for mixing a signal outputted from the high frequency receiving circuit with the local oscillation signal; a setting data generating unit for outputting a setting data corresponding to a predetermined reception frequency; and a digital-analog converter for generating a tuning voltage corresponding to the setting data outputted from the setting data generating unit, and for changing the tuning voltage with a predetermined temperature coefficient in accordance with ambient temperature.

The digital-analog converter according to the present invention also comprises a temperature coefficient setting section constituted by including elements having predetermined temperature coefficients, and changes the device constant of the temperature coefficient setting section as a whole in accordance with ambient temperature, thereby making the output voltage of the digital-analog converter corresponding to input data changed with a predetermined temperature coefficient in accordance with ambient temperature. In the tuning circuit according to the present invention, a tuning frequency is set in accordance with the tuning voltage generated by using the above described digital-analog converter, and when the ambient temperature changes, the tuning voltage generated by the digital-analog converter is changed in accordance with the temperature coefficient, thereby enabling the tuning frequency to be kept constant.

Since the digital-analog converter has a predetermined temperature coefficient, when the control voltage applied to the local oscillator is changed in accordance with ambient temperature, the tuning voltage can also be changed similarly. Accordingly, an expensive temperature compensating capacitor need not be used for constituting the high frequency receiving circuit and the tuning circuit, as a result of which component costs can be reduced.

The above described high frequency receiving circuit and the local oscillator, each preferably includes a resonance circuit in which a variable capacitance diode, of which electrostatic capacitance can be changed by the control voltage or the tuning voltage, is connected with a coil. Specifically, in the resonance circuit included in each of the high frequency receiving circuit and the local oscillator, the variable capacitance diode and the coil are preferably connected in the same form. In this way, the high frequency receiving circuit and the local oscillator, which are arranged to have the same configuration, make it possible to make tendencies of changes in the oscillation frequency or the tuning frequency depending on ambient temperature match with each other, thereby enabling the temperature compensation to be performed only by adjusting the temperature coefficient of the digital-analog converter for generating the tuning voltage.

In the above described digital-analog converter, the tuning voltage is preferably changed in accordance with ambient temperature so as to prevent the reception frequency of the high frequency receiving circuit from fluctuating in accordance with variation of ambient temperature. This enables the tracking error when the reception frequency is varied to be reliably prevented from occurring.

The above described digital-analog converter preferably comprises the temperature coefficient setting section constituted by including elements having a predetermined temperature coefficient, so as to allow the device constant of the temperature coefficient setting section as a whole to be changed in accordance with ambient temperature. In this way, by providing the temperature coefficient setting section for a part of the digital-analog converter, the temperature characteristic of the digital-analog converter as a whole can be set arbitrarily within a predetermined range.

It is also preferred that the above described temperature coefficient setting section includes a plurality of resistances which are formed by a semiconductor manufacturing process and which have temperature coefficients different to each other, and that the connection form of the plurality of resistances is set so that the temperature coefficient of the digital-analog converter becomes a predetermined value. Specifically, each of the plurality of resistances is preferably formed by a poly-silicon on a semiconductor substrate so that the temperature coefficients of the resistances are made different by adjusting impurity concentration and carrier types of the poly-silicon. Alternatively, each of the plurality of resistances is preferably formed by utilizing a p-type region or an n-type region on a semiconductor substrate so that temperature coefficients of the resistances are made different by adjusting impurity concentration and carrier types of the p-type region or the n-type region. This enables the digital-analog converter including the temperature coefficient setting section, the receiver and other component parts to be formed on a semiconductor substrate, thereby enabling costs to be reduced by facilitating manufacturing and by reducing the number of components.

The above described digital-analog converter preferably comprises a current source of which current value is set in accordance with a value of inputted setting data and the temperature coefficient setting section into which the current generated by the current source flows, so as to output a voltage across the temperature coefficient setting section as the tuning voltage. Such configuration of the digital-analog converter facilitates changing of the output voltage of the digital-analog converter in accordance with the temperature coefficient of the temperature coefficient setting section.

BEST MODE FOR CARRYING OUT THE INVENTION

Hereafter, an FM receiver of an embodiment according to the present invention will be described with reference to the accompanying drawings.

Figure 1:
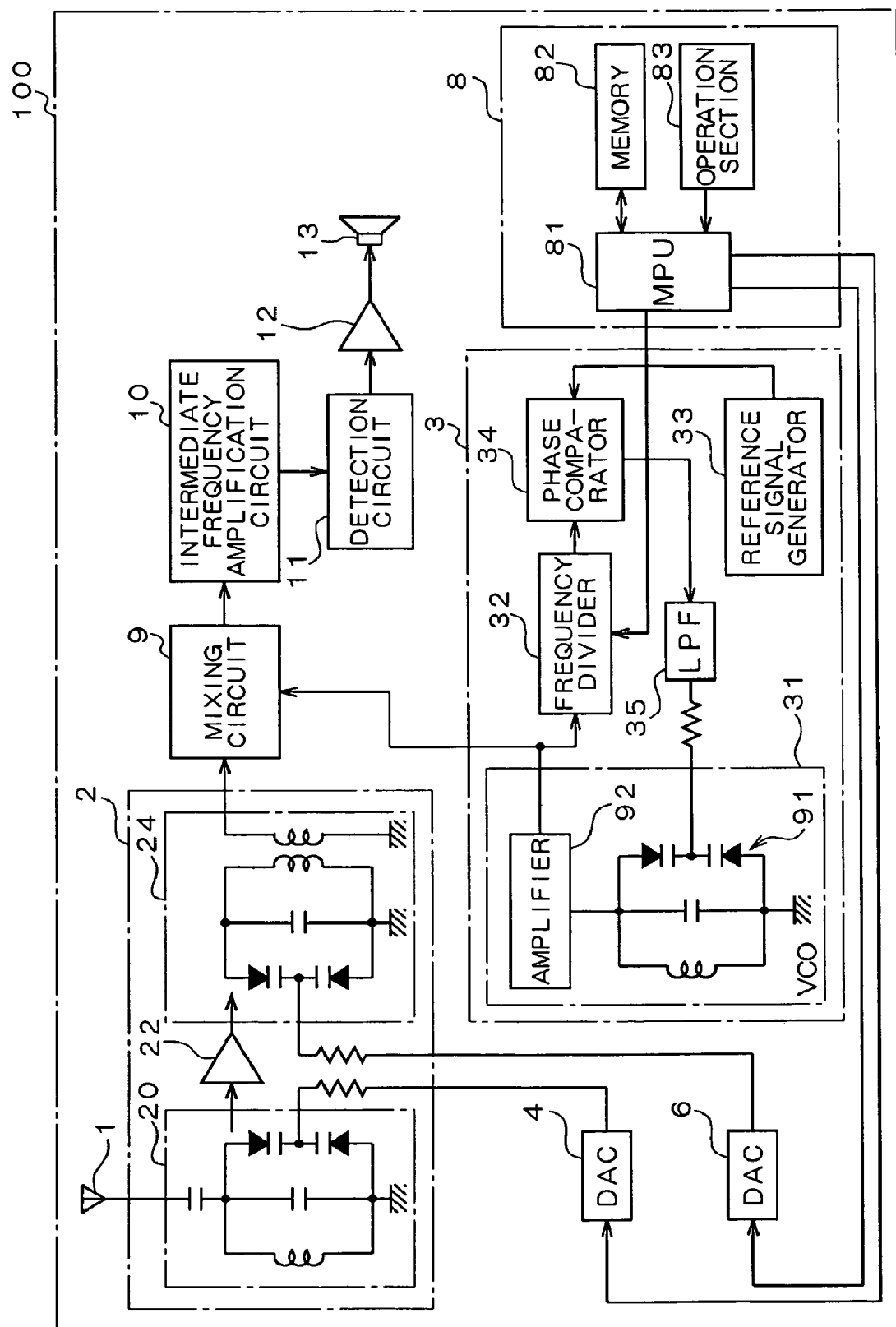
FIG. 1 is a figure showing a configuration of an FM receiver according to an embodiment.

FIG. 1 is a figure showing a configuration of an FM receiver according to an embodiment. An FM receiver 100 shown in the figure is constituted by including an antenna 1, a high frequency receiving circuit 2, a local oscillator 3, two digital-analog converters (DACs) 4, 6, a control section 8, a mixing circuit 9, an intermediate frequency amplification circuit 10, a detection circuit 11, a low frequency amplification circuit 12 and the speaker 13.

The high frequency receiving circuit 2, which performs a tuning operation on a broadcast wave inputted from the antenna 1 for selectively passing only components in the vicinity of a predetermined tuning frequency, and which performs high frequency amplification of the signal after tuning, is constituted by including an antenna tuning circuit 20, a RF amplification circuit 22 and a RF tuning circuit 24.

The output of the antenna tuning circuit 20 to which the antenna 1 is connected is amplified by the RF amplification circuit 22 and the amplified output is further made to pass the RF tuning circuit 24, for improving selectivity. A variable capacitance diode for varying the tuning frequency is included in each of the antenna tuning circuit 20 and the RF tuning circuit 24. By changing the tuning voltage of reverse bias applied to the variable capacitance diode, each tuning frequency of the antenna tuning circuit 20 and the RF tuning circuit 24 is interlockingly changed. That is, in the high frequency receiving circuit 2, a broadcast wave of a reception frequency (tuning frequency) is selected in accordance with the tuning voltage applied to the antenna tuning circuit 20 and the RF tuning circuit 24.

The local oscillator 3 is constituted by including a voltage controlled oscillator (VCO) 31, a frequency divider 32, a reference signal generator 33, a phase comparator 34 and a low pass filter (LPF) 35.

The VCO 31, which performs an oscillation operation of a frequency corresponding to a control voltage generated by the low pass filter 35 so as to output a local oscillation signal, is provided with a VCO resonance circuit 91 and an amplifier 92. The VCO resonance circuit 91 is a parallel resonance circuit consisting of a coil and a capacitor which are connected in parallel with two variable capacitance diodes for varying the resonance frequency. In addition, by changing the capacitance of the variable capacitance diodes in accordance with the applied control voltage of reverse bias, the resonance frequency of the VCO resonance circuit 91 is changed. The amplifier 92 performs a predetermined amplification operation required for the oscillation.

The frequency divider 32 divides the local oscillation signal inputted from the VCO 31 by a predetermined division ratio N and outputs the divided signal. The value of the division ratio N is variably set by the control section 8. The reference signal generator 33 outputs a reference signal of a predetermined frequency with high frequency stability.

The phase comparator 34 compares phases between the reference signal outputted from the reference signal generator 33 and the signal (local oscillation signal after division) outputted from the frequency divider 32, and outputs a pulse-like error signal in accordance with the phase difference. The low pass filter 35 generates the control voltage by removing high frequency components of the pulse-like error signal outputted from the phase comparator 34 and by smoothing the error signal. The VCO 31, the frequency divider 32, the phase comparator 34 and the low pass filter 35 are connected in a looped state so as to constitute a PLL (phase locked loop).

In addition, each of the variable capacitance diodes which are included in each of the antenna tuning circuit 20 and the RF tuning circuit 24 in the above described high frequency receiving circuit 2, and which are included in the VCO resonance circuit 91 in the local oscillator 3, is used so as to be provided with substantially the same voltage to capacitance characteristic. Each resonance circuit constituted by including the variable capacitance diodes has the same configuration in which the variable capacitance diodes, a capacitor and a coil are connected in parallel with each other. In this way, by making the high frequency receiving circuit 2 configured similarly to the VCO 31 in the local oscillator 3, the tendencies of changes in the oscillation frequency and the tuning frequency depending on ambient temperature can be made to coincide with each other, thereby enabling the temperature compensation to be performed only by adjusting the temperature coefficient of the DACs 4, 6.

The DAC 4 generates the tuning voltage applied to the antenna tuning circuit 20 in the high frequency receiving circuit 2. The DAC 6 generates the tuning voltage applied to the RF tuning circuit 24 in the high frequency receiving circuit 2. Specifically, the DACs 4, 6 generate voltages in accordance with values of setting data inputted from the control section 8 as a setting data generating unit. The DACs 4, 6 have a predetermined temperature coefficient, the value of which output voltage changes in accordance with ambient temperature. Further details of the DACs 4, 6 will be described below.

The control section 8 controls the entire operation of the FM receiver 100, and is constituted by including a MPU 81, a memory 82 and an operation section 83. The MPU 81 performs predetermined control operations for setting the division ratio N of the frequency divider 32 in the local oscillator 3 in accordance with a set value of the reception frequency inputted from the operation section 83, and for setting data to be inputted into each of the DACs 4, 6, and the like. The memory 82 stores operation programs of the MPU 81. The operation section 83 comprises various kinds of operation keys, and used for setting the reception frequency and the like.

The mixing circuit 9 mixes a reception signal outputted from the high frequency receiving circuit 2 with the local oscillation signal outputted from the local oscillator 3, so as to output a signal corresponding to the difference component between the signals.

The intermediate frequency amplification circuit 10 generates an intermediate frequency signal by amplifying the signal outputted from the mixing circuit 9 and by making only frequency components in the vicinity of a predetermined intermediate frequency (10.7 MHz) pass through.

The detection circuit 11 applies detection processing to the intermediate frequency signal outputted from the intermediate frequency amplification circuit 10, and demodulates a voice signal. The low frequency amplification circuit 12 amplifies the voice signal outputted from the detection circuit 11 by a predetermined gain. The speaker 13 performs a voice output based on the voice signal after the amplification outputted from the low frequency amplification circuit 12.

Figure 2:
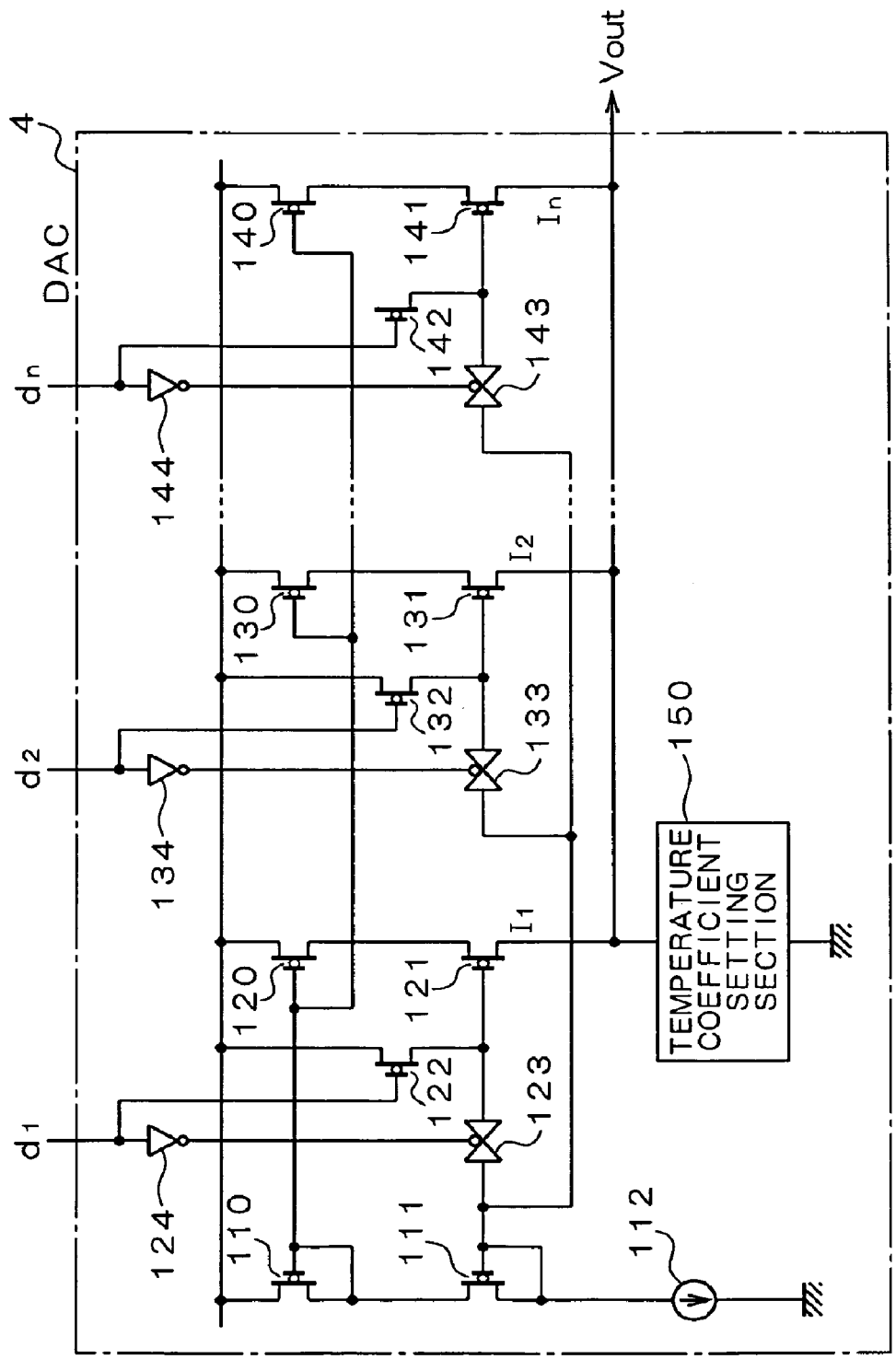
FIG. 2 is a figure showing a detailed configuration of a DAC.

FIG. 2 is a figure showing a detailed configuration of the DAC 4. Since the DAC 6 also has the same configuration as the DAC 4, the detailed explanation thereof is omitted.

As shown in FIG. 2, the DAC 4 is constituted by including FETs 110, 111, 120, 121, 122, 130, 131, 132, ..., 140, 141, 142, a current source 112, analog switches 123, 133, ..., 143, inverter circuits 124, 134, ..., 144 and a temperature coefficient setting section 150.

A first current mirror circuit is constituted by using the FETs 110, 111, the current source 112, and the FETs 120, 121, and the validity/invalidity of operation of the first current mirror circuit are controlled by a switching circuit constituted by the inverter circuit 124, the FET 122 and the analog switch 123. The first current mirror circuit corresponds to the first bit $d_1$ of input data of the DAC 4. Since both the analog switch 123 and the FET 122 are turned on when the first bit $d_1$ is "1", i.e. the signal inputted into the inverter circuit 124 is at a high-level, the operation of the first current mirror circuit is effective for making a predetermined current $I_1$, flow.

Also, a second current mirror circuit is constituted by using the FETs 110, 111, the current source 112 and the FETs 130, 131, and the validity/invalidity of operation of the second current mirror circuit is controlled by a switching circuit constituted by the inverter circuit 134, the FET 132 and the analog switch 133. The second current mirror circuit corresponds to the second bit $d_2$ of input data of the DAC 4. Since both the analog switch 133 and the FET 132 are turned on when the second bit $d_2$ is "1", i.e. the signal inputted into the inverter circuit 134 is at a high-level, the operation of the second current mirror circuit is effective for making a predetermined current $I_2$ flow.

Similarly, an n-th current mirror circuit is constituted by using the FETs 110, 111, the current source 112 and the FETs 140, 141, and the validity/invalidity of operation of the n-th current mirror circuit is controlled by a switching circuit constituted by the inverter circuit 144, the FET 142 and the analog switch 143. The n-th current mirror circuit corresponds to the n-th bit $d_n$ of input data of the DAC 4. Since both the analog switch 143 and the FET 142 are turned on when the n-th bit $d_n$ is "1", i.e. the signal inputted into the inverter circuit 144 is at a high-level, the operation of the n-th current mirror circuit is effective for making a predetermined current $I_n$ flow.

In present embodiment, among n-bit data inputted into the DAC 4, the first bit $d_1$, corresponds to the least significant bit, and the n-th bit $d_n$ corresponds to the most significant bit. If the current $I_1$ generated by the first current mirror circuit is defined as 1, the gate width (channel width) W and the gate length (channel length) L of each FET are set such that the current $I_2, I_3, \ldots, I_n$ generated by the second, the third, ..., and the n-th current mirror circuits become twice ($=2^1$), four ($=2^2$) times, ..., $2^{(n-1)}$ times.

The above described first to n-th current mirror circuits are connected in parallel so as to form a current source, and when two or more current mirrors operate simultaneously, each of the current generated by the plurality of current mirror circuits is added together. Accordingly, it is possible to generate the current corresponding to the value of input data by selectively operating the above described first to n-th current mirror circuits corresponding to the value of each bit of the input data. The current thus generated is supplied to the temperature coefficient setting section 150.

The temperature coefficient setting section 150 is a combined resistance constituted by combining a plurality of resistances, each having a different temperature coefficient, and the device constant (resistance value) of the combined resistance as a whole changes in accordance with ambient temperature. Generally, it is known that the temperature coefficient of the resistance which is formed on a semiconductor substrate by a semiconductor manufacturing process can be easily differentiated to about three kinds of temperature coefficients by changing kinds and concentration of impurity. For example, in the case where the resistance is formed with a poly-silicon on a semiconductor substrate, the temperature coefficient from −several thousands to + several hundreds ppm/° C. can be easily realized by adjusting impurity concentration and carrier types (p-type or n-type). Alternatively, the resistance is similarly formed in the case where the diffusion resistance of a p-type region or an n-type region formed on a semiconductor substrate is utilized instead of the poly-silicon, and the temperature coefficient from − several thousands to + several hundreds ppm/° C. can be easily realized by adjusting impurity concentration and carrier types. In view of the case where three kinds of resistances R1, R2, R3 whose temperature coefficients are largely different to each other can be formed on a semiconductor substrate, the temperature coefficient of the temperature coefficient setting section 150 as a whole can be freely set within a predetermined range by changing resistance values and connection methods of the three kinds of resistances R1 to R3.

Figure 3:
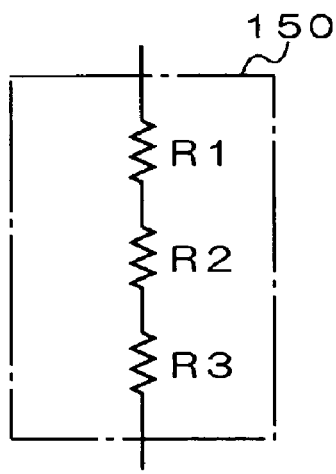
FIG. 3 is a figure showing a configuration of a temperature coefficient setting section in which three kinds of resistances are connected in series.

FIG. 3 is a figure showing a configuration of the temperature coefficient setting section 150 in which three kinds of resistances are connected in series. When each resistance value of three kinds of resistances R1 to R3 are defined as $r_1$, $r_2$, $r_3$, and each temperature coefficient of the three kinds of resistances R1 to R3 are defined as $a_1$, $a_2$, $a_3$, the temperature coefficient $b_1$ of the temperature coefficient setting section 150 as a whole shown in FIG. 3 is expressed as follows.

$$b_1=(a_1r_1+a_2r_2+a_3r_3)/(r_1+r_2+r_3)$$

When a current supplied to the temperature coefficient setting section 150 is defined as I, the output voltage $V_{out}$ of the DAC 4 appearing at one end of the temperature coefficient setting section 150 is expressed as follows.

$$V_{out}=(r_1+r_2+r_3)I$$

The output voltage $V_{out}$ fluctuates by $\Delta V=(a_1r_1+a_2r_2+a_3r_3)$ I, when ambient temperature is changed by 1° C.

Figure 4:
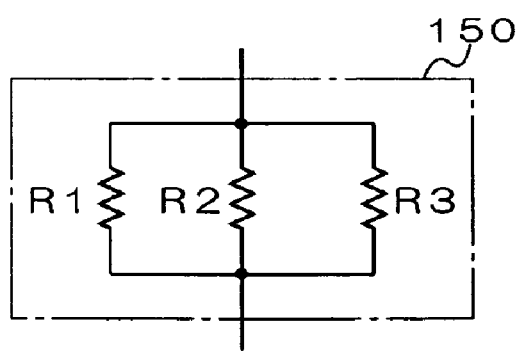
FIG. 4 is a figure showing a configuration of the temperature coefficient setting section in which three kinds of resistances are connected in parallel.

FIG. 4 is a figure showing a configuration of the temperature coefficient setting section 150 in which three kinds of resistances are connected in parallel. The temperature coefficient $b_2$ of the temperature coefficient setting section 150 as a whole shown in FIG. 4 is expressed as follows.

$$b_2=a_1a_2a_3(r_1r_2+r_2r_3+r_3r_1)/(a_1a_2r_1r_2+a_2a_3r_2r_3+a_3a_1r_3r_1)$$

The output voltage $V_{out}$ of the DAC 4 appearing at one end of the temperature coefficient setting section 150 is expressed as follows.

$$V_{out}=r_1r_2r_3I/(r_1r_2+r_2r_3+r_3r_1)$$

The output voltage $V_{out}$ fluctuates by $\Delta V=a_1a_2a_3r_1r_2r_3I/(a_1a_2r_1r_2+a_2a_3r_2r_3+a_3a_1r_3r_1)$, when ambient temperature is changed by 1° C.

Figure 5:
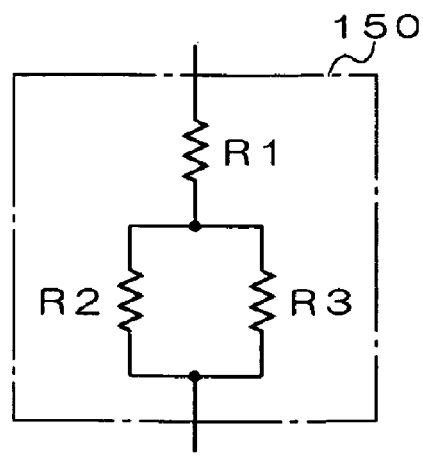
FIG. 5 is a figure showing a configuration of the temperature coefficient setting section in which three kinds of resistances are connected in series and in parallel.

FIG. 5 is a figure showing a configuration of the temperature coefficient setting section 150 in which the three kinds of resistances are connected in series and in parallel. The temperature coefficient $b_3$ Of the temperature coefficient setting section 150 as a whole shown in FIG. 5 is expressed as follows.

$$b_3=(a_1r_1+a_2a_3r_2r_3/(a_2r_2+a_3r_3))/(r_1+r_2r_3/(r_2+r_3))$$

The output voltage $V_{out}$ of the DAC 4 appearing at one end of the temperature coefficient setting section 150 is expressed as follows.

$$V_{out}=(r_1+r_2r_3/(r_2+r_3))I$$

The output voltage $V_{out}$ fluctuates by $\Delta V=(a_1r_1+a_2a_3r_2r_3/(a_2r_2+a_3r_3))$ I, when ambient temperature is changed by 1° C.

In this way, the DACs 4, 6 included in the FM receiver 100 according to the present embodiment have a predetermined temperature coefficient, so that even if data inputted from the MPU 81 is fixed, the output voltage $V_{out}$ is arranged to be changed when the temperature changes. Thereby, even if ambient temperature changes, it is possible to keep the tuning frequency of the antenna tuning circuit 20 and the RF tuning circuit 24 constant.

In particular, the DACs 4, 6 make the tuning voltage changed in accordance with ambient temperature so as to prevent the tuning frequency (reception frequency) of the antenna tuning circuit 20 and the RF tuning circuit 24 from being changed depending on variations of ambient temperature, as a result of which the tracking error can be reliably prevented from occurring when the reception frequency is changed.

The DACs 4, 6 also comprises the temperature coefficient setting section 150 constituted by including the resistances R1 to R3 which have predetermined temperature coefficients, and the device constant (resistance value) of the temperature coefficient setting section 150 as a whole is arranged to be changed in accordance with ambient temperature. For this reason, it is possible to arbitrarily set the temperature characteristic of the DACs 4, 6 as a whole within a predetermined range. In addition, the DACs 4, 6 are constituted by combining the temperature coefficient setting section 150 and the current source, and the current supplied from the current source is made to flow into the temperature coefficient setting section 150, thereby enabling the output voltage of the DACs 4, 6 to be easily changed in accordance with the temperature coefficient of the temperature coefficient setting section 150.

Further, the temperature coefficient can be set arbitrarily to some extent by changing connection methods of the three kinds of resistances R1 to R3 in the temperature coefficient setting section 150, or by changing each temperature coefficient of the resistances R1 to R3. Accordingly, when the control voltage applied to the VCO 31 from the low pass filter 35 is changed in accordance with ambient temperature, the output voltage of the DACs 4, 6 can be changed similarly, thereby enabling expansion of the tracking error associated with the temperature change to be prevented.

The DACs 4, 6, the antenna tuning circuit 20 and the RF tuning circuit 24, etc. according to the present embodiment, are also constituted without using expensive components, such as the temperature compensating capacitor, so that component costs can be reduced. Further, the temperature coefficient setting section 150 in the DACs 4, 6 can be realized by controlling kinds and concentration of impurities by using semiconductor processes, such as a CMOS process or a MOS process, so that the components for temperature compensation can be formed on a semiconductor substrate. For this reason, in the case where each component constituting the FM receiver 100 is formed on a semiconductor substrate, it is possible to reduce external components, so as to make the cost further reduced.

The present invention is not limited to the above described embodiments, and various variations are possible within the scope and spirit of the invention. For example, although the case where a temperature coefficient is provided for the DACs 4, 6 included in the FM receiver 100 is considered in the above described embodiment, the temperature coefficient may also be provided for a DAC included in other receivers such as the AM receiver, and other transmitters and communication apparatuses.

Although the DACs 4, 6 for generating a current in accordance with a value of each bit of input data are explained in the above described embodiment, the present invention may also be applied to a receiver, etc. in which DACs using other method, for example, a DAC of R-2R resistance type or load resistor type, etc. are used. In these cases, the temperature coefficient setting section 150 may be comprised in a power supply for generating a predetermined operating voltage so as to make the value of the operating voltage generated by the power supply changed in accordance with ambient temperature. This method may also be applied to the current-type DACs 4, 6 in FIG. 2. That is, in FIG. 2, the temperature coefficient setting section 150 may be replaced by a resistance having a fixed resistance value, and a power supply which include the temperature coefficient setting section 150, and of which output voltage is varied in accordance with ambient temperature, may be provided so as to make the output voltage of the power supply applied to each drain of the FETs 110, 120, 130, . . . , 140.

Although the case where the temperature coefficient setting section 150 included in the DACs 4, 6 are constituted by combining three kinds of resistances R1 to R3 having different temperature coefficients is explained in the above described embodiment, in the case where four or more kinds of resistances having different temperature coefficients can be formed by changing kinds and concentration of impurities which are added by diffusion and implantation in a semiconductor process, the temperature coefficient setting section 150 may also be constituted by combining these four or more kinds of resistances. Alternatively, in the case where a predetermined temperature coefficient can be obtained by combining two kinds of resistances, or by using a kind of resistance, the temperature coefficient setting section 150 may be arranged to be constituted by using two kinds of resistances or a kind of resistance.

Although the temperature coefficient of the DACs 4, 6 as a whole is made to be a desired value by changing combination of resistances in the temperature coefficient setting section 150 in the above described embodiment, in the case where each component other than the temperature coefficient setting section 150 in the DACs 4, 6 has a temperature coefficient which can not be neglected, the temperature coefficient of the temperature coefficient setting section 150 may also be set so as to enable the temperature coefficient of the DACs 4, 6 as a whole, including these components and the temperature coefficient setting section 150, to be a predetermined value.

Although the case where the resonance circuit in which the variable capacitance diode and the coil are connected in parallel is included in each of the antenna tuning circuit 20, the RF tuning circuit 24 and the VCO 31 is explained in the above described embodiment, the resonance circuit in which these elements are connected in series may also be arranged to be included.

INDUSTRIAL APPLICABILITY

As described above, according to the present invention, since the digital-analog converter has a predetermined temperature coefficient, when the control voltage applied to the local oscillator is changed in accordance with ambient temperature, the tuning voltage can also be changed similarly. Accordingly, the high frequency receiving circuit and the tuning circuit need not be constituted by using an expensive temperature compensating capacitor, as a result of which component costs can be reduced.

The invention claimed is:

1. A digital-analog converter comprising a temperature coefficient setting section constituted by including elements having predetermined temperature coefficients, wherein an output voltage corresponding to input data is changed with a predetermined temperature coefficient in accordance with ambient temperature, by changing a device constant of said temperature coefficient setting section as a whole in accordance with ambient temperature.

2. The digital-analog converter according to claim 1, wherein said temperature coefficient setting section comprises a plurality of resistances which is formed by a semiconductor manufacturing process and which have temperature coefficients different to each other, and wherein a connection form of said plurality of resistances is set so that a temperature coefficient of said plurality of resistances as a whole becomes a predetermined value.

3. The digital-analog converter according to claim 2, wherein each of said plurality of resistances is formed by a poly-silicon on a semiconductor substrate, and wherein the temperature coefficient is made different by adjusting impurity concentration and carrier types of said poly-silicon.

4. The digital-analog converter according to claim 2, wherein each of said plurality of resistances is formed by utilizing a p-type region or an n-type region on a semiconductor substrate, and wherein the temperature coefficient is made different by adjusting impurity concentration and carrier types of said p-type region or said n-type region.

5. The digital-analog converter according to claim 1, further comprising a current source of which current value is set in accordance with a value of said inputted setting data, wherein a current generated by said current source flows into said temperature coefficient setting section and a voltage across said temperature coefficient setting section is outputted as said tuning voltage.

6. A tuning circuit having a tuning frequency being set in accordance with a tuning voltage generated by using the digital-analog converter according to claim 1, said tuning circuit making said tuning frequency kept constant by changing said tuning voltage generated by said digital-analog converter in accordance with said temperature coefficient, when ambient temperature is changed.

* * * * *